US008000102B2

(12) United States Patent
Johnston et al.

(10) Patent No.: US 8,000,102 B2
(45) Date of Patent: Aug. 16, 2011

(54) APPARATUS AND ARRANGEMENT FOR HOUSING VOLTAGE CONDITIONING AND FILTERING CIRCUITRY COMPONENTS FOR AN ELECTROSTATIC PRECIPITATOR

(75) Inventors: David Fulton Johnston, Poquoson, VA (US); Terry Lewis Farmer, Kearney, MO (US); Easel Roberts, Kansas City, MO (US); Dan Steinhaur, London (CA)

(73) Assignee: Babcock & Wilcox Power Generation Group, Inc., Barberton, OH (US)

( * ) Notice: Subject to any disclaimer, the term of this patent is extended or adjusted under 35 U.S.C. 154(b) by 173 days.

(21) Appl. No.: 12/544,608

(22) Filed: Aug. 20, 2009

(65) Prior Publication Data

US 2011/0043999 A1 Feb. 24, 2011

(51) Int. Cl.
*H05K 7/20* (2006.01)
(52) U.S. Cl. ............................ 361/699; 336/65; 336/90
(58) Field of Classification Search ....................... None
See application file for complete search history.

(56) References Cited

U.S. PATENT DOCUMENTS

| | | | | |
|---|---|---|---|---|
| 1,619,332 | A * | 3/1927 | Dann | 165/104.33 |
| 3,249,817 | A * | 5/1966 | Sinclair et al. | 361/699 |
| 3,474,369 | A * | 10/1969 | Keogh | 336/65 |
| 3,564,386 | A * | 2/1971 | Leonard | 363/141 |
| 3,710,002 | A | 1/1973 | Link | |
| 4,209,064 | A | 6/1980 | Cacalloro et al. | |
| 4,429,347 | A * | 1/1984 | Seitz | 361/677 |
| 5,736,915 | A * | 4/1998 | Goedde et al. | 336/55 |
| 6,611,440 | B1 | 8/2003 | Johnston et al. | |
| 6,770,810 | B2 * | 8/2004 | Wiebe et al. | 174/50 |
| 6,839,251 | B2 | 1/2005 | Johnston et al. | |
| 6,905,638 | B2 * | 6/2005 | Corkran et al. | 252/579 |
| 6,914,195 | B2 | 7/2005 | Archambault et al. | |
| 7,142,410 | B2 | 11/2006 | Norris et al. | |
| 7,161,456 | B2 * | 1/2007 | Knox | 336/90 |

* cited by examiner

*Primary Examiner* — Gregory Thompson
(74) *Attorney, Agent, or Firm* — Eric Marich

(57) ABSTRACT

A unitary-enclosure housing apparatus and arrangement for protecting and cooling the high voltage electronic conditioning and filtering circuitry components used for providing a high-voltage waveform to an electrostatic precipitator device includes a hermetically sealed dielectric liquid coolant filled tank/housing having one or more side-mounted hollow-panel type radiator structures for dissipating heat from the coolant. The disclosed unitary-enclosure housing apparatus and the particular arrangement of the internal electronic components results in a relatively external small footprint while containing both the transformer-rectifier (TR) set and high-voltage resistor-capacitor (R-C) filter components associated with a high-voltage electrostatic precipitator device in a single unitary package. The housing apparatus is outfitted with a removable top cover plate and access panel for providing easy access to the TR set and R-C filter components. A coolant drain spigot is also provided on the housing for simplifying the draining and replacement of coolant liquid.

28 Claims, 11 Drawing Sheets

APPARATUS AND ARRANGEMENT FOR HOUSING VOLTAGE CONDITIONING AND FILTERING CIRCUITRY COMPONENTS FOR AN ELECTROSTATIC PRECIPITATOR

The subject matter disclosed herein relates to a unitary enclosure housing apparatus for protecting and cooling voltage conditioning and filtering circuitry components conventionally used for providing a current-controlled pulsing high-voltage waveform to an electrostatic precipitator device.

BACKGROUND

Some of the primary sources of industrial air pollution today include particulate matter produced from the combustion of fossil fuels, engine exhaust gases, and various chemical processes. An electrostatic precipitator provides an efficient way to eliminate or reduce particulate matter pollution produced during such processes. The electrostatic precipitator generates a strong electrical field that is applied to process combustion gases/products passing out an exhaust stack. Basically, the strong electric field charges any particulate matter discharged along with the combustion gases. These charged particles may then be easily collected electrically before exiting the exhaust stack and are thus prevented from polluting the atmosphere. In this manner, electrostatic precipitators play a valuable role in helping to reduce air pollution.

A conventional single-phase power supply for an electrostatic precipitator characteristically includes an alternating current voltage source of 380 to 600 volts having a frequency of either 50 or 60 Hertz. Typically, silicon-controlled rectifiers (SCRs), which may be controlled using a conventional automatic voltage control circuit device, are used to manage the amount of power and modulate the time that an alternating current input is provided to the input of a transformer and a full-wave bridge rectifier (called a TR set). The full-wave bridge rectifier converts the alternating current from the output of the transformer to a pulsating direct current and also doubles the alternating current frequency to either 100 or 120 Hertz, respectively. The high-voltage direct-current output produced is then provided to the electrostatic precipitator device. Typically, a low pass filter in the form, of a current limiting choke coil/reactance device such as an inductor and/or resistor is electrically connected in series between the silicon-controlled rectifiers and the input to the transformer for limiting the high frequency energy and shaping the output voltage waveform.

The electrostatic precipitator essentially operates as a big capacitor that has two conductors separated by an insulator. The precipitator discharge electrodes and collecting plates form the two conductors and the exhaust gas that is being cleaned acts as the insulator. Basically, the electrostatic precipitator performs two functions: the first is that it functions as a load on the power supply so that a corona discharge current between the discharge electrodes and collecting plates can be used to charge/collect particles; and the second is that it functions as a low pass filter. Since the capacitance of this low pass filter is of a relatively low value, the voltage waveform of the electrostatic precipitator has a significant amount of ripple voltage.

During operation, one phenomenon that can limit the electrical energization of the electrostatic precipitator is sparking. Sparking occurs when the gas that is being treated in the exhaust stack has a localized breakdown so that there is a rapid rise in electrical current with an associated decrease in voltage. Consequently, instead of having a corona current distributed evenly across an entire charge field volume within the electrostatic precipitator, there is a high amplitude spark that funnels all of the available current through one path across the exhaust gas rather than innumerable coronal discharge paths dispersed over a large area of the exhaust gas. Sparking can cause damage to the internal components of the electrostatic precipitator as well as disrupt the entire operation of the electrostatic precipitator. Therefore, an automatic voltage control circuit device is used to interrupt power once a spark is sensed. The current limiting reactance device then acts as a low pass filter to cut off delivery of any potentially damaging high frequency energy to the transformer. During this brief quench period, the current dissipates through this localized path of electrical conduction until the spark is extinguished and then the voltage is reapplied.

Therefore, to improve particle collection efficiency, it is necessary that the ripple voltage in the electrostatic precipitator be reduced. This is important since the presence of a ripple voltage results in a peak value of the voltage waveform for the electrostatic precipitator that is greater than the average value of the voltage waveform for the electrostatic precipitator. Therefore, since the peak value of the voltage waveform for the electrostatic precipitator must not exceed the breakdown or sparking voltage level due to the problems associated with sparking described above, the average voltage for operating the electrostatic precipitator must be kept at a lower level. Unfortunately, this lower level of average voltage adversely affects the particle collection efficiency of the electrostatic precipitator.

One method of accomplishing a reduction in ripple voltage involves using a pulsating direct current voltage mechanism that is operable to receive power from a single-phase alternating current voltage source along with a spiral wound filter capacitor in an arrangement where the pulsating direct current voltage mechanism is electrically connected in parallel to the spiral wound filter capacitor and the spiral wound filter capacitor is electrically connected in parallel to the electrostatic precipitator. An example circuit diagram of this type of prior art electrostatic precipitator is illustrated in FIG. 1 and discussed in detail in U.S. Pat. Nos. 6,839,251 and 6,611,440. As shown by FIG. 1, at least one spiral wound filter capacitor 62 is connected electrically in parallel with electrostatic precipitator 66 and acts to reduce voltage ripple and reshape the voltage waveform applied to the electrostatic precipitator so that when utilizing a single phase power supply the minimum value, average value and peak value of the applied voltage waveform are substantially the same. The use of one or more spiral wound filter capacitors 62 in this manner has the advantage of decreasing potentially damaging sparking currents and attenuating normal corona current.

Conventionally, the above described high voltage electrical components required for this type of electrostatic precipitator are not manufactured and housed all together in a single common enclosure. In fact, all of the components together occupy a significant amount of space and consequently impose significant space and footprint requirements for an installation. Unfortunately, locations in which such electrostatic precipitators and their associated voltage controlling electronics are typically used suffer from a dearth of available installation space. Accordingly, there is great need for an electrostatic precipitator system having a housing arrangement that encloses all or most of the above electrical components within a single compact housing that is safe, reliable, easy to install, occupies a relatively small volume and spatial footprint, is cost effective and provides sufficient and efficient heat dissipation for all of the housed components.

BRIEF DESCRIPTION

A single housing apparatus and arrangement is described and disclosed for housing and cooling the electronic components associated with operating a high-voltage electrostatic precipitator used in industrial processes. The non-limiting illustrative example housing apparatus and arrangement disclosed herein is intended to enclose both a transformer-rectifier (T-R) set as well as a high-voltage resistor-capacitor (R-C) filter network of an electrostatic precipitator device together within a single enclosure and dissipate all of the excess heat generated by those components. To improve heat dissipation, the housing apparatus is filled with a high-dielectric non-conducting liquid coolant and fitted with heat-dissipating fin structures on one or more sides. The housing apparatus may be constructed of metal or other suitable materials and may be provided with a removable top portion and an coolant drain spigot or the like for simplifying coolant changes. The top portion of the housing may also be outfitted with an additional smaller access panel for enabling direct and easy access to the R-C filter network components contained within. In one beneficial aspect, since all of the high-voltage components of an electrostatic precipitator are conventionally not housed together in a single same enclosure, the exemplary housing apparatus disclosed herein provides an improvement over prior art electrostatic precipitators in that a much smaller spatial footprint may be achieved than previously available.

The disclosed non-limiting illustrative example implementation of the electrostatic precipitator component housing apparatus and arrangement of component housed therein is designed to have the T-R set and R-C filter network electronic components packaged within the housing, thus allowing it offer significant cost savings to a buyer when compared to conventional arrangements used for commercial HV electrostatic precipitators. Size and space requirements at the installation site can be reduced since the conventional practice of mating the T-R set and R-C filter network gear on-site is eliminated. Installation site labor is also reduced since the precipitator voltage control component housing apparatus/arrangement includes the high voltage T-R set and R-C filter network components.

DETAILED DESCRIPTION

Figure 1:
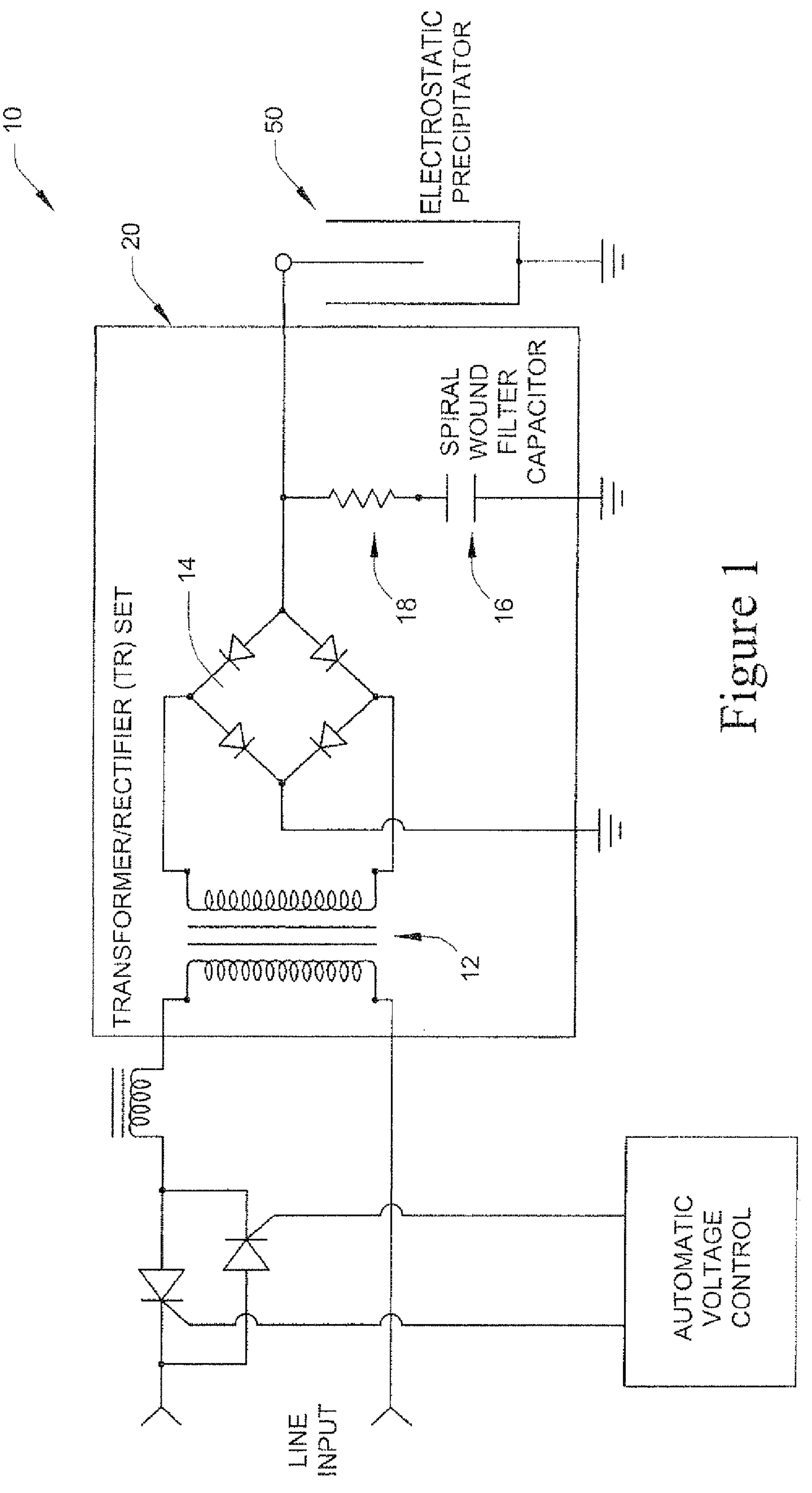
FIG. 1 is an example schematic electrical circuit diagram of a prior art electrostatic precipitator system utilizing a T/R set and an R-C filter consisting of a spiral wound filter capacitor and a series connected resistor, where the combination of resistor and capacitor is electrically connected in parallel with an electrostatic precipitator.

In FIG. 1, an example schematic circuit diagram of a voltage conditioning and filtering circuit conventionally used for providing a currently-controlled pulsing high-voltage waveform to an electrostatic precipitator device is generally indicated at numeral 10. The voltage control circuit 10 for conditioning and filtering the output voltage waveform to an electrostatic precipitator device 50 includes AC current input controlling SCRs connected to some conventional voltage control circuitry, a Transformer-Rectifier set (12, 14) and an R-C filter network (16, 18) consisting of high-voltage spiral wound filter capacitor 16 and an optional series connected current limiting resistor 18. The output of the series combination of spiral wound capacitor 16 and optional resistor 18 is electrically connected in parallel with electrostatic precipitator device 50, which is placed in an exhaust gas stack outside and away from component housing 20.

For example, an alternating current voltage, which is in the form of a sinusoidal waveform that goes between a negative value for one-half cycle and a positive value for one-half cycle with a value of zero volts between each half cycle, is applied to the line input terminals. This alternating current line input voltage may typically range from 380 to 600 volts and have a frequency of 50 or 60 Hertz. One line input terminal is electrically connected in series to a cathode of a first silicon-controlled rectifier and is also electrically connected in series to an anode of a second silicon-controlled rectifier in an inverse parallel relationship. Only one of the silicon-controlled rectifiers and conducts during any particular half cycle. The gate of the first silicon-controlled rectifier and the gate of the second silicon-controlled rectifier are both electrically connected to a conventional automatic voltage control circuit/device. This automatic voltage control circuit applies a positive trigger voltage to either the gates of the two silicon-controlled rectifiers (SCRs) to initiate a current carrier avalanche within an silicon-controlled rectifier to allow current during either the positive or negative portion of the alternating current cycle to flow from either the anode of one SCR or the cathode of the other SCR, respectively. This enables the SCRs to turn on (conduct current) at the same voltage level during a half cycle and remain, turned on until the current through one or the other SCR falls below a predetermined level.

A conventional automatic voltage control circuit/device is provided for power control and for regulating the amount of time that, the ac voltage line which is electrically connected to the input line terminals remains conducting. In addition, when a spark occurs, the automatic voltage control circuit/device stops providing an trigger/avalanche voltage to the gates of the SCRs to allow the spark to extinguish. A representative automatic voltage control device is disclosed in U.S. Pat. No. 5,705,923, which issued to Johnston et al, on Jan. 6, 1998 and is assigned to BHA Group, Inc. and entitled "Variable Inductance Current Limiting Reactor Control System for Electrostatic Precipitator". The anode of the first SCR and the cathode of the second SCR are electrically connected in series to a current limiting reactor device. The current limiting reactor filters and shapes the voltage waveform leaving the SCRs. Ideally, the shape of the voltage waveform leaving the current limiting reactor will be broad since the average value equates to total work and since such a voltage waveform typically yields the best collection efficiency for an electrostatic precipitator. Ideally, the peak and average values of the voltage signal entering the electrostatic precipitator device should be very close. Moreover, enhanced power transfer is attained when the toad impedance matches the line impedance. Therefore, the reactance value of the current limiting choke coil reactance device is preferably predetermined so that the inductance of the current limiting reactor device matches the total circuit impedance including the load of the electrostatic precipitator device.

Figure 2:
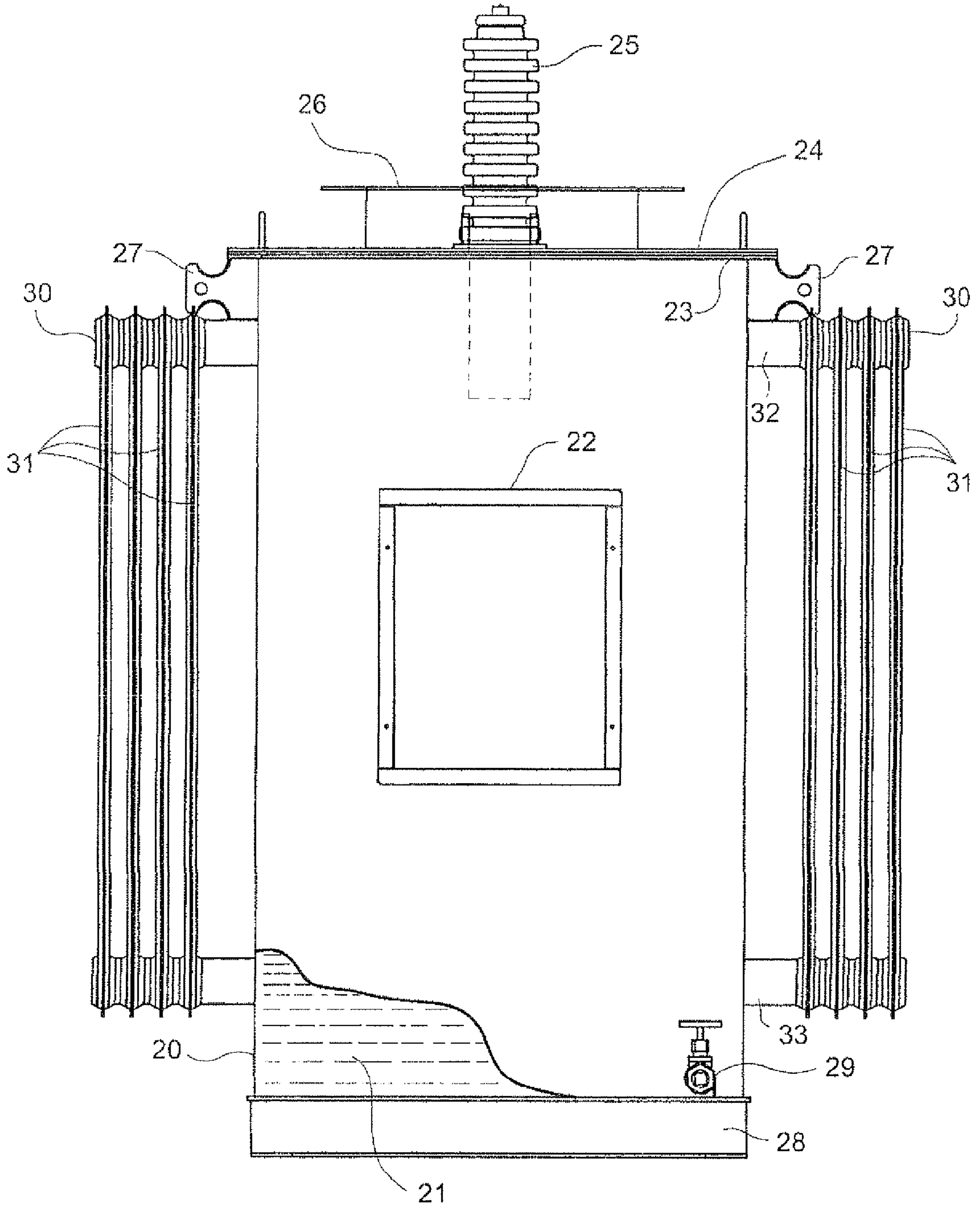
FIG. 2 is a front plan view with a cut-away portion of a non-limiting illustrative example housing for the high voltage components of an electrostatic precipitator.

Referring next to FIG. 2, the component housing apparatus and arrangement comprises a main like metal or thermoplastic component tank/housing structure 20 having a large internal tank area and a smaller external low-voltage component compartment 22. The larger interior tank portion of tank/housing 20 is preferably filled to within a few inches of top cover plate 24 with an electrically non-conductive dielectric liquid coolant 21 such as an oil that has high breakdown voltage and thermal conduction/dissipation characteristics. The smaller low-voltage component compartment 22 contains no liquids and houses only the relatively lower voltage components of the precipitator voltage control system such as the AC current input controlling SCRs and the automatic voltage control circuitry of FIG. 1. During operation, the high-voltage electrical components precipitator voltage control system are contained immersed, in dielectric liquid 21 within the interior tank portion of tank/housing and 20 are cooled by circulating convection currents produced within, dielectric liquid 21. Tank/housing 20 also includes an external circumferential top flange 23 and a top cover plate 24 which are provided with an appropriate means for securing cover 24 to flange portion 23 of the housing, e.g., holes for securing bolts, screws, rivets or the like. A gasket or the like (not shown) may be used between the edge of cover 24 and flange 23 to prevent loss or leakage of liquid coolant 21, ensure the interior is maintained free of dust and other contaminants, and to reduce incursion of moisture.

A high-voltage insulating bushing 25 is located at the top of tank/housing 20 and includes a portion which passes through cover plate 24 into the interior of tank/housing 20. An end portion, of bushing 25 is preferably submerged within dielectric liquid coolant 21 and acts as an output terminal conductor pass-through to the outside of tank/housing 20. A protective guard ring 26 on cover plate 24 surrounds insulator 25. Handle structures 35 are provided on cover plate 24 for assisting removal of the cover plate. External mounting brackets 27 are also provided beneath flange 23 on two upper sides of tank/housing 20 near each of the corners. Holes are provided along flange 23 and along the edge of cover plate 24 for insertion of bolts to secure the cover plate to the tank/housing. Likewise, bolt holes may also be provided in cover access panel 34 and cover plate 24 for use in securing the access panel to the housing top cover plate. A support base 28 is provided on the bottom of tank/housing 20. In addition, an liquid coolant drain valve/spigot 29 is provided on one side near the bottom of tank/housing 20.

Attached to each of two opposite sides of tank/housing 20 is a conventional panel type radiator 30 comprising a plurality of vertically-extending hollow panels 31 disposed in face-to-face, horizontally spaced-apart relationship with vertical passages between the exterior faces of the panels. Each radiator 30 includes a pair of vertically-spaced header pipes 32 and 33 at its upper and lower ends communicating with the interior of the tank 20 at its upper and lower ends, respectively. The normal liquid level of coolant 21 in the tank/housing 20 is above the location of the upper header pipe 32.

When the electrostatic precipitator is in operation, the liquid coolant in tank/housing 20 becomes heated. The heated coolant rises to the top of the tank/housing through natural convection, entering the radiator through the upper pipe 32. As the coolant is cooled within the radiator 30, it flows downwardly within hollow panels 31, returning to the tank interior through the lower pipe 33 as relatively cool liquid. The coolant continues circulating in this manner, moving upwardly within the tank 20 and downwardly within the radiator 30, as the electrostatic precipitator is operated. Each radiator 30, of course, serves to extract heat from the coolant as it flows downwardly through and within each radiator portion, thus limiting the temperature of the coolant within tank/housing 20.

Figure 3:
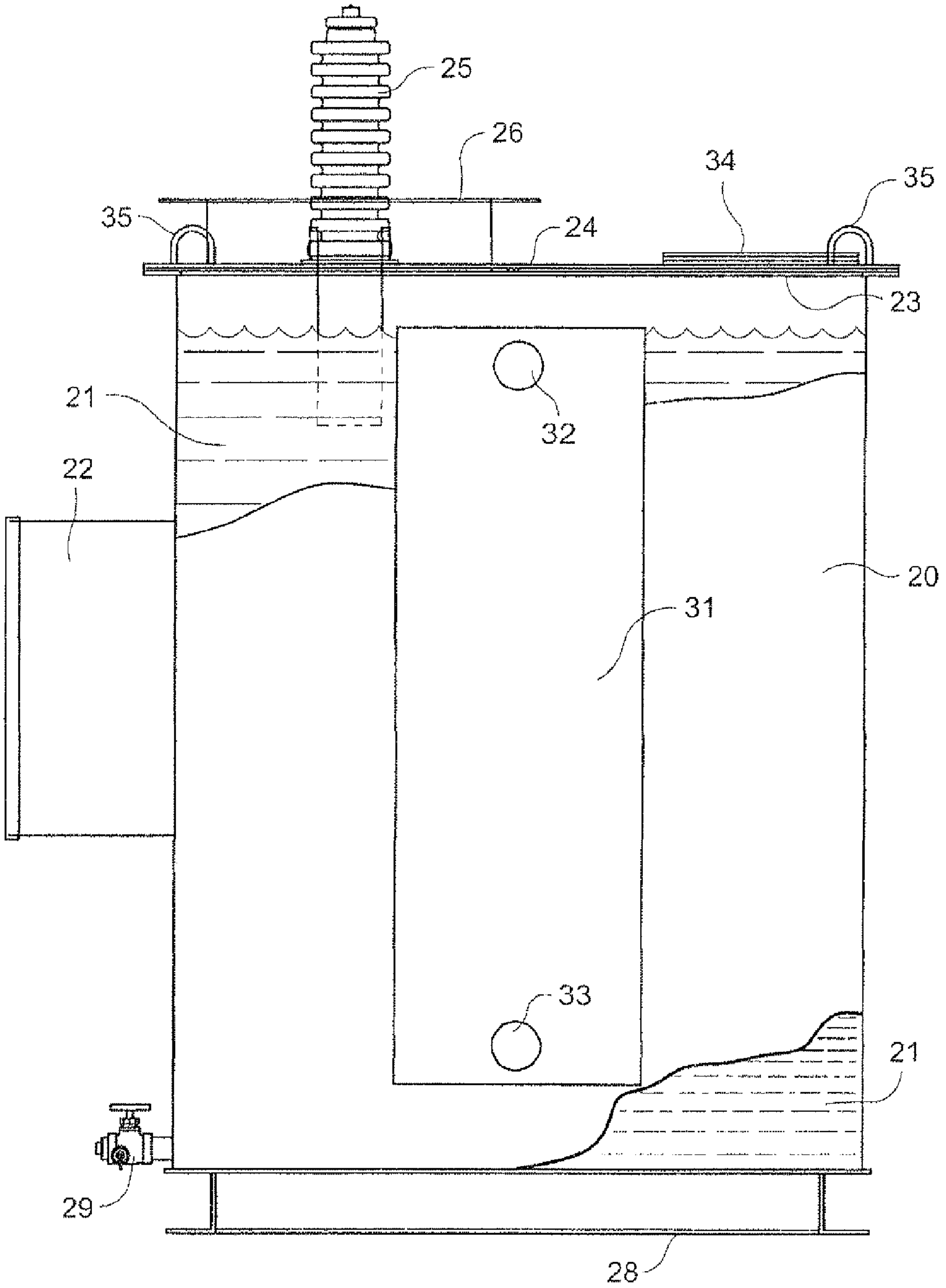
FIG. 3 is a side plan view of a non-limiting illustrative example housing for the high voltage components of an electrostatic precipitator.

FIG. 3 provides a side view of the tank/housing structure 20 of FIG. 2. The numerals shown in FIG. 3 correspond to the components and feature described above with respect to FIG. 2.

Figure 4:
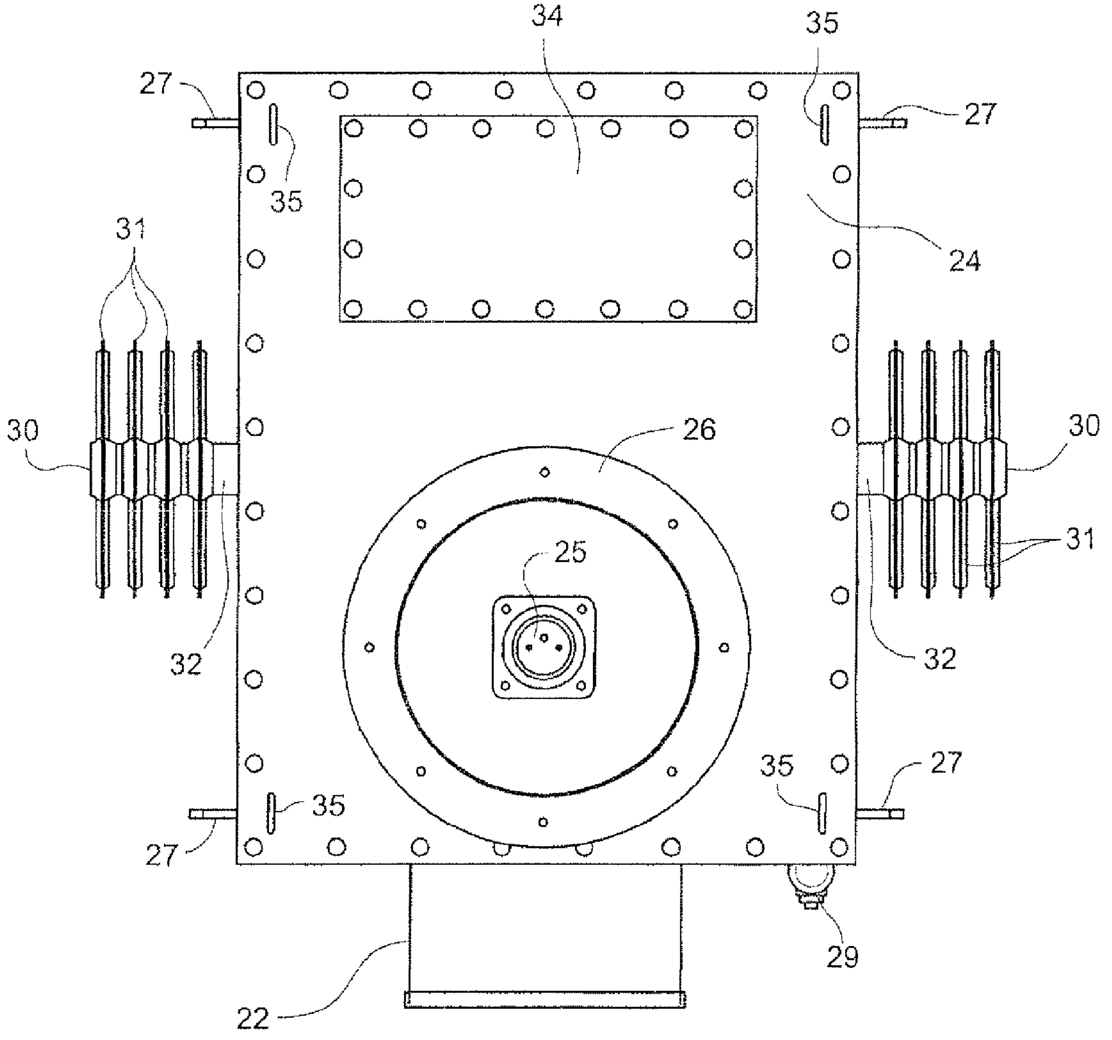
FIG. 4 is a top plan view of a non-limiting illustrative example housing for the high voltage components of an electrostatic precipitator.

FIG. 4 shows a top plan view of the tank/housing structure 20 shown in FIG. 2. In this top view, each side mounted radiator 30 along with insulating bushing 25, guard ring 26 and front-mounted external low-voltage component compartment 22 are shown. Housing cover 24 is shown provided with a removable access panel 34. Other numerals shown in FIG. 4 correspond to the identically numbered features and components in FIGS. 2 and 3 as described above.

Figure 5:
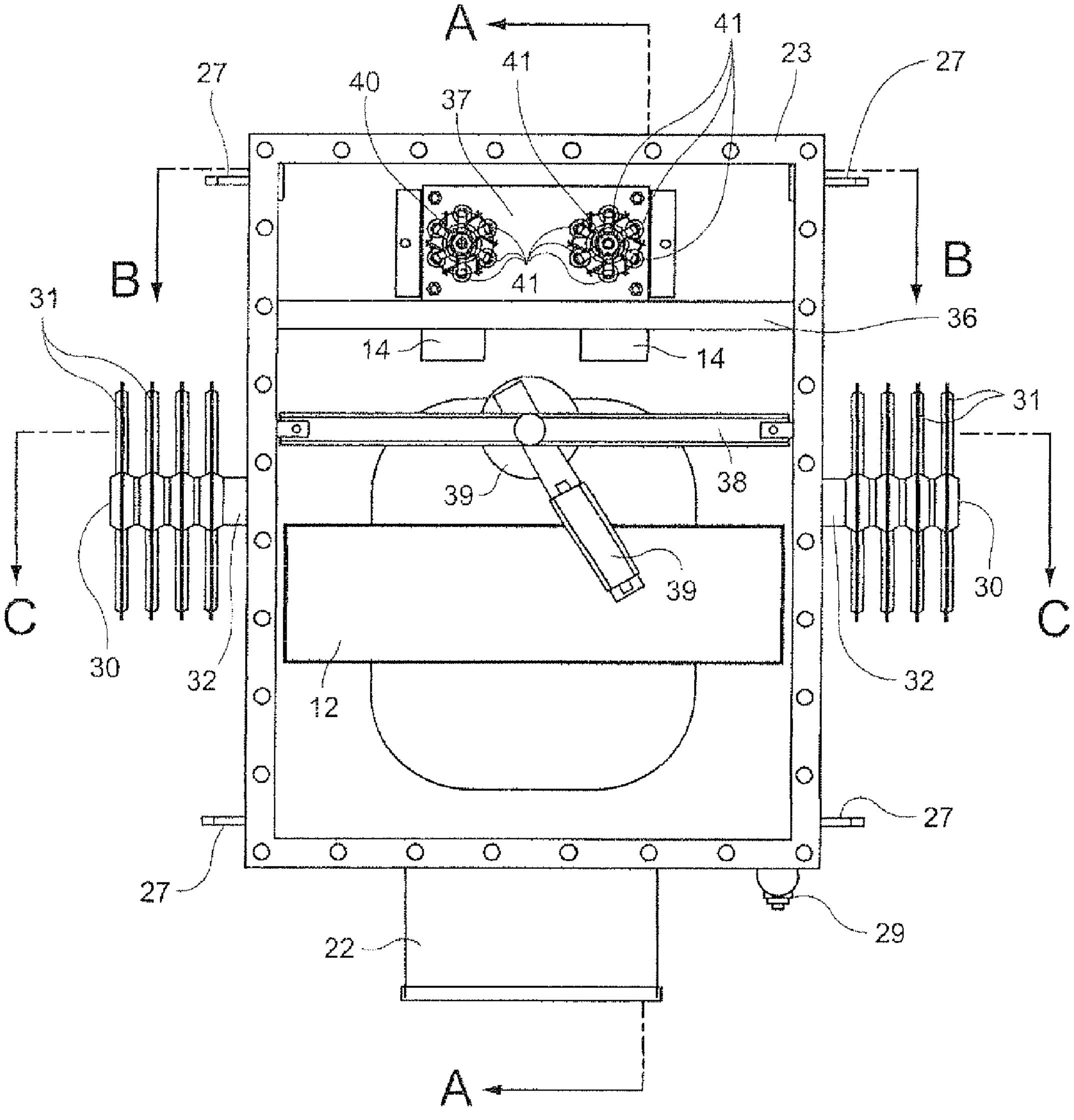
FIG. 5 is a top plan view of a non-limiting illustrative example housing for the high voltage components an electrostatic precipitator with the top panel removed to show the arrangement of internal electrical components.

Referring now to FIG. 5, a top plan view of housing 20 is shown with the top cover plate 24 removed to reveal an arrangement of the electrical components housed within. Transformer 12 and a pair of bridge rectifier components 14 comprising the T-R set (12, 14) of the circuit in FIG. 1 are shown from above. Bridge rectifier components 14 are mounted on a vertical heat-sink plate/partition (not shown) suspended from cross-bar bracket 36. Next to bridge rectifier components 14 and cross-bar support bracket 36 is a capacitor casing 37 which houses spiral-wound capacitor 16. Between support bracket 36 and above transformer 12 is a support bracket 38 which supports the current limiting choke coil/reactance device components 39. Also shown from an overhead view are two insulators 40 and a plurality of high-voltage resistors 41, which are mounted on top of spiral-wound capacitor casing 37. This mounting arrangement is better illustrated in FIG. 6, which shows a cross sectional profile view of FIG. 5 along lines A-A.

Figure 6:
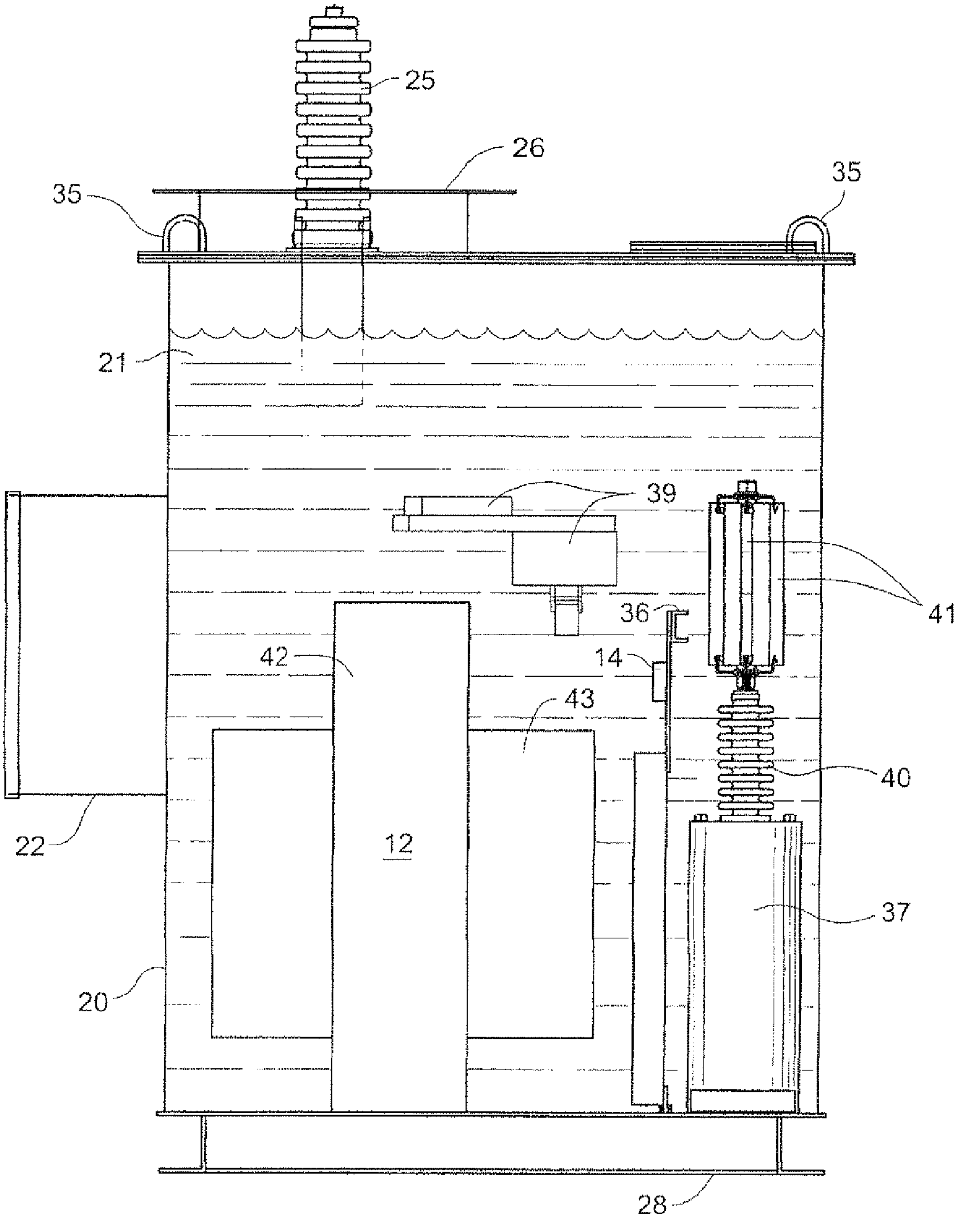
FIG. 6 is a cross-sectional side plan view along the lines A-A of FIG. 5.

As more clearly illustrated in FIG. 6, an insulator 40 is mounted on top of spiral-wound capacitor casing 37 and a set of six high-voltage resistors 41 are mounted on top of insulator 40. Although not explicitly shown in the FIGURES, the wiring between electrical components is arranged such that a spiral-wound capacitor 16 within casing 37 is wired in series with high-voltage resistors 41, which are connected together in parallel to form the current limiting resistance 18 of the circuit in FIG. 1. Also depicted are the dielectric liquid coolant 21 and the relative positions of choke coil/reactance device components 39 with respect to transformer 12 and spiral-wound capacitor casing 37 within tank/housing 20. Transformer 12 is also shown as comprising a central laminated core section 42 with core windings 43.

Figure 7:
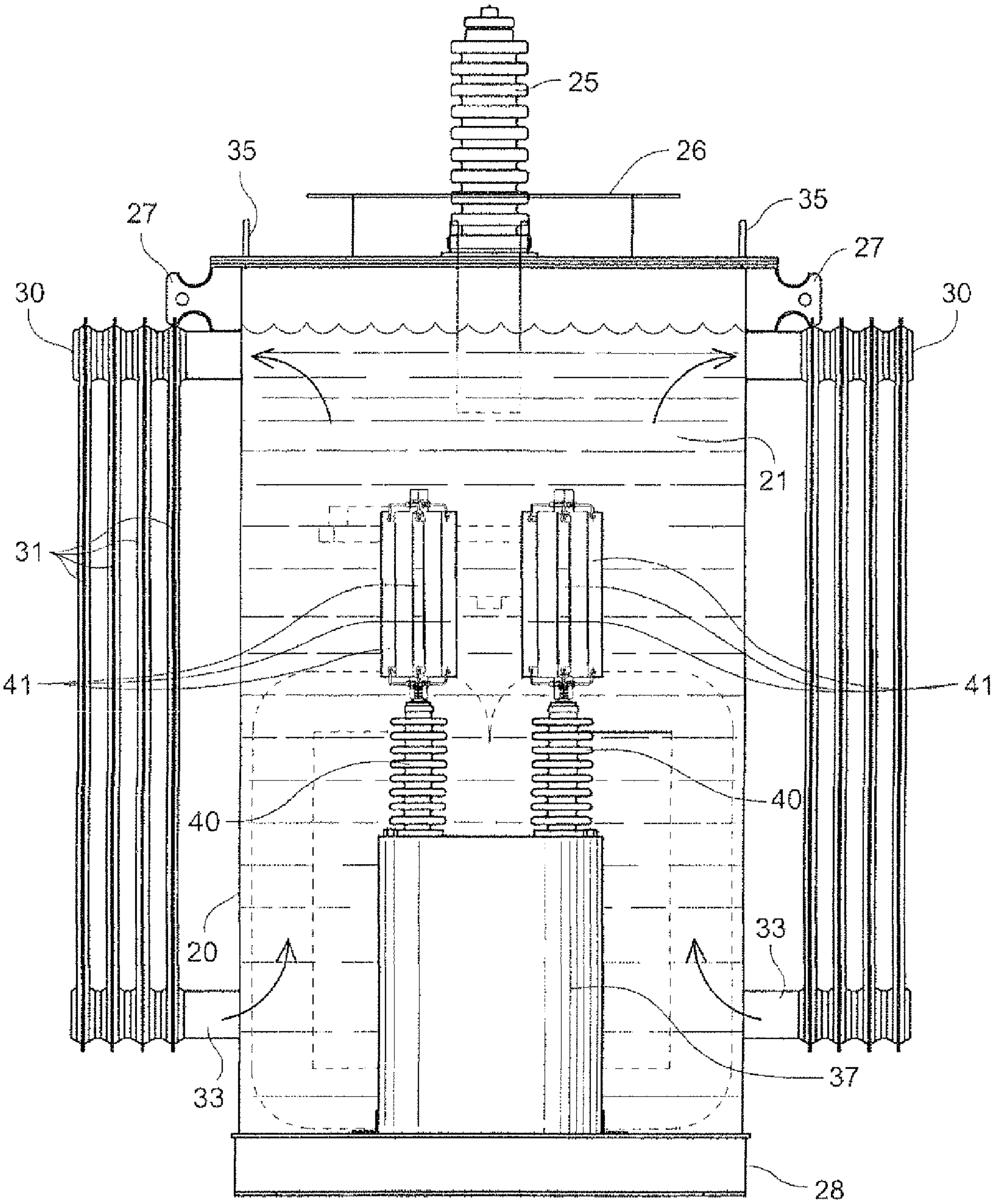
FIG. 7 is a cross-sectional side view plan along the lines B-B of FIG. 5.
Figure 8:
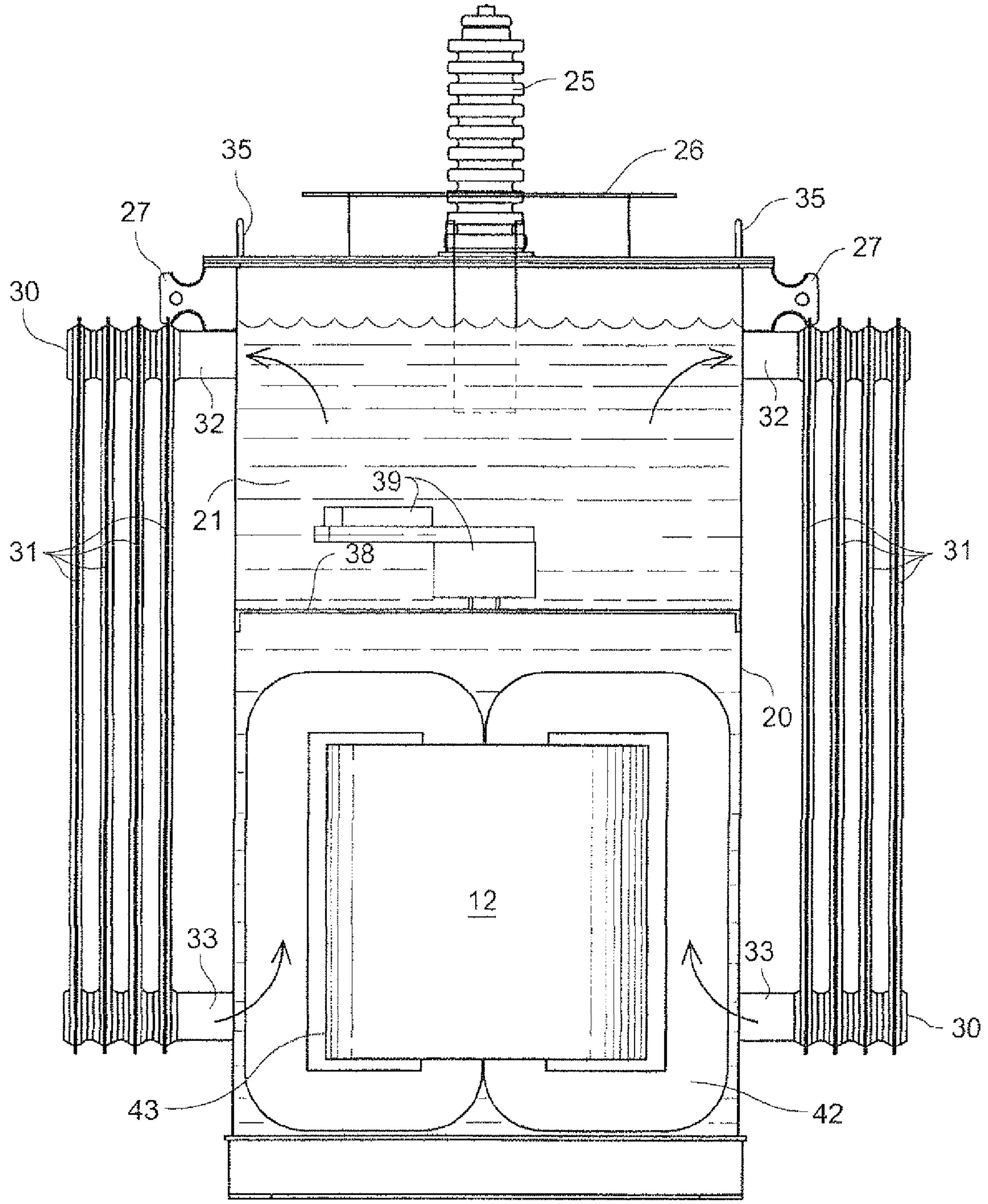
FIG. 8 is a cross-sectional side view along plan the lines C-C of FIG. 5.

FIG. 7 shows a cross-sectional profile view of the tank/housing and components of FIG. 5 along lines B-B. This view illustrates the mounting arrangement and positional relationships of components within tank/housing 20 for capacitor casing 37 along with the pair of insulators 40 on top of capacitor casing 37 and the gangs of high-voltage resistors 41. FIG. 8, likewise, shows a cross-sectional view of FIG. 5 along the lines C-C. This view serves to more clearly illustrates the relative positional relationships within tank/housing 20 of transformer 12, choke coil/reactance device components 39 and reactance device support bracket 38.

Figure 9:
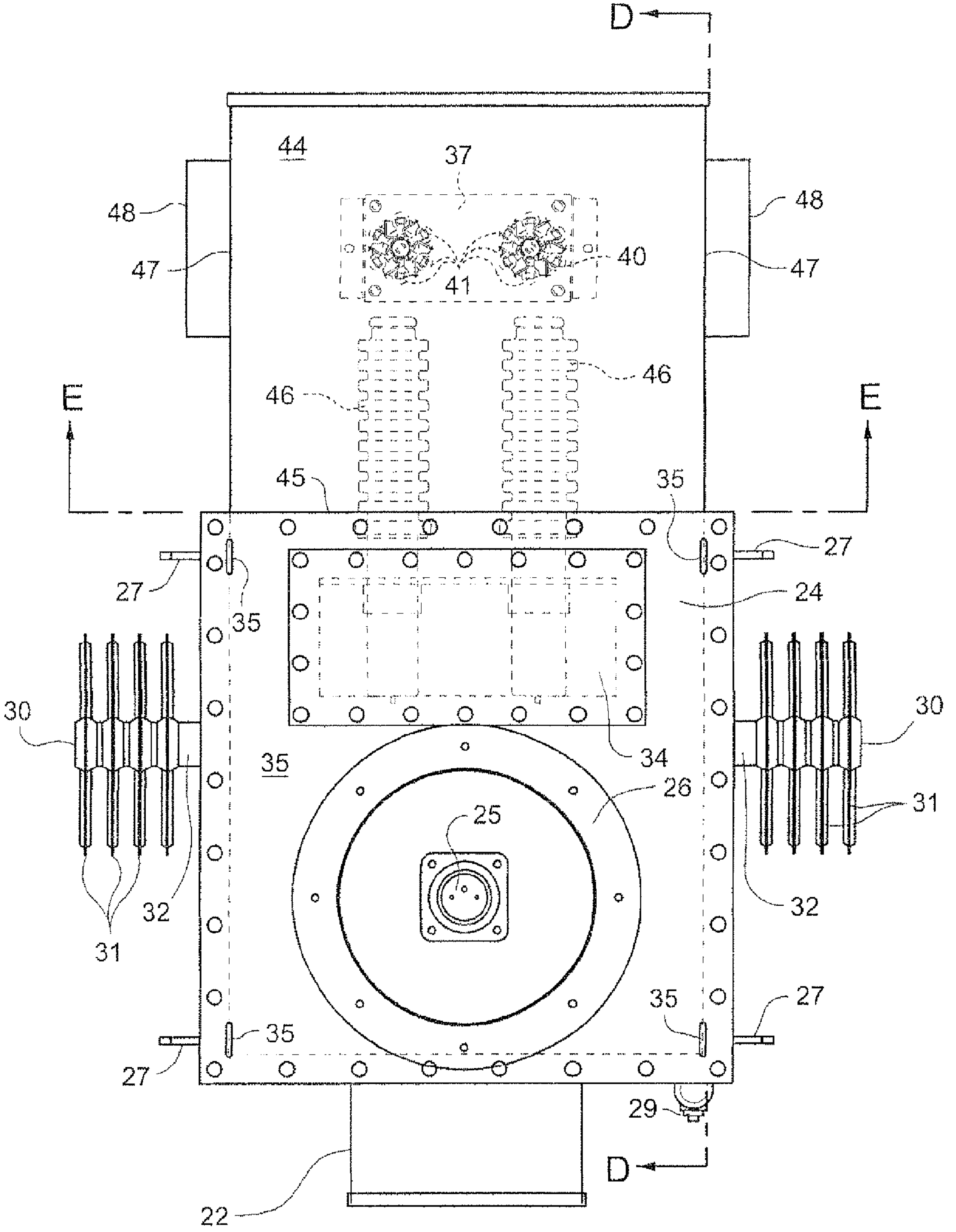
FIG. 9 is a top plan view of an alternative example enclosure and internal component arrangement for housing high voltage components of an electrostatic precipitator.

Referring now to FIG. 9, a top plan view of an alternative non-limiting illustrative example housing and internal component arrangement for housing the high voltage components of an electrostatic precipitator is shown. In this example, an electrostatic precipitator component housing is provided with a liquid-cooled portion 20 which contains transformer 12, bridge rectifier 14, and reactance device components 39, and a liquid-free air-cooled portion 44 which contains the spiral-wound capacitor 37, insulator 40 and high-voltage resistor components 41. The air-cooled portion 44 and liquid-cooled portion 20 share a common sidewall 45 with through which one or more horizontally mounted high voltage insulating bushings 46 protrude. An end portion of insulating bushing 46 is preferably submerged within dielectric liquid coolant 21 and serves as a high voltage conductor pass-through from the liquid-cooled tank portion 20 to the air-cooled portion 44 of the housing. The air-cooled portion 44 is provided with one or more side air-flow vent openings 47 and vent guards 48. Other numerals shown in FIG. 9 correspond to the identically numbered features and components in FIGS. 2-6 as described above.

Figure 10:
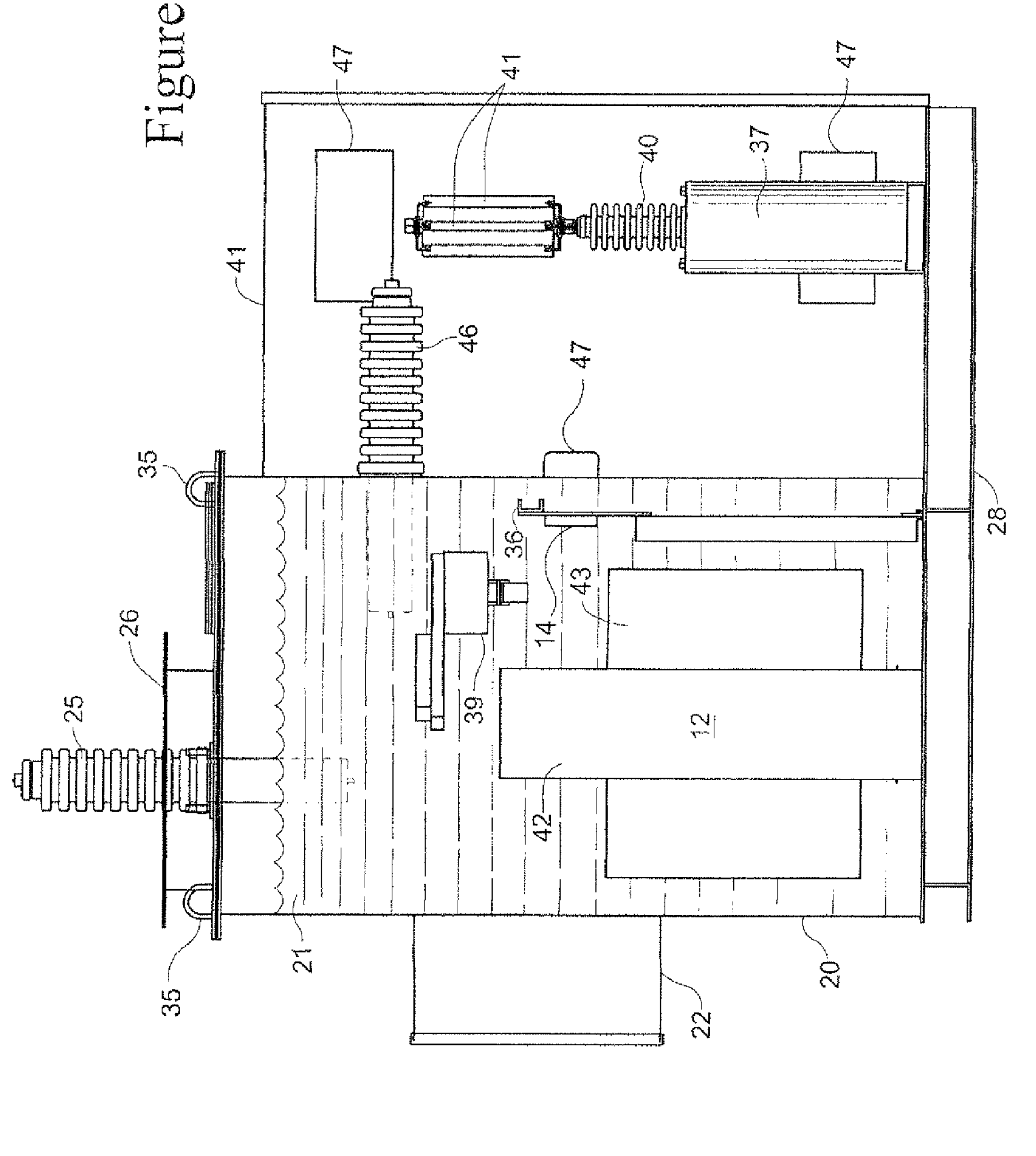
FIG. 10 is a cross-sectional side plan view along the lines D-D of FIG. 9.
Figure 11:
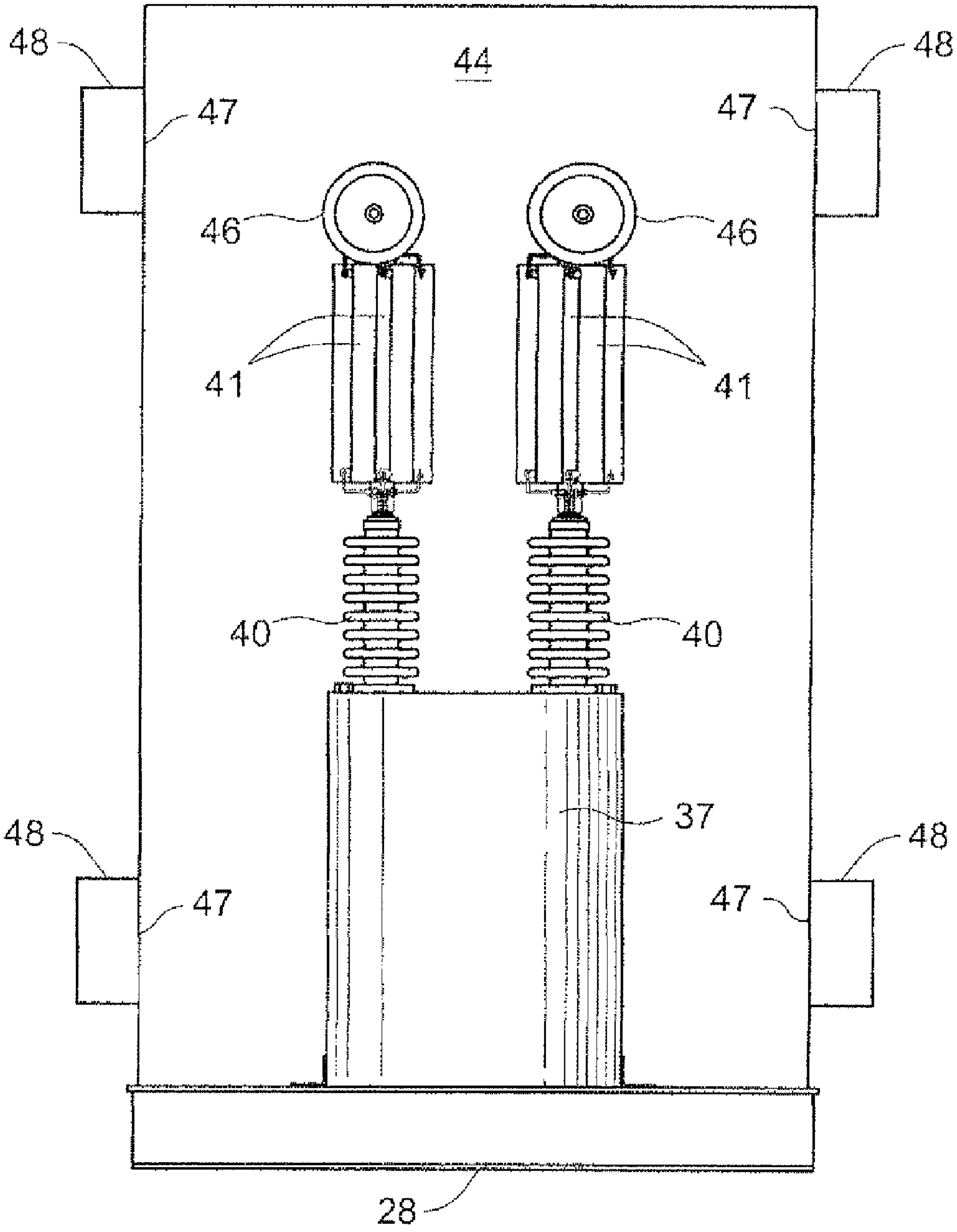
FIG. 11 is a cross-sectional side plan view along the lines E-E of FIG. 9.

FIG. 10 shows a cross-sectional side view along lines D-D of the alternative tank/housing example of FIG. 9. This view more clearly illustrates the mounting arrangement and positional relationships of components within the liquid-cooled tank, portion 20 and components within the air-cooled portion 44 of the housing. For example, transformer 12, bridge rectifier 14, and reactance device components 39 are shown as submerged In dielectric cooling fluid 21 within the liquid-cooled portion 20, whereas spiral-wound capacitor casing 37 along with insulator 40 on top of capacitor casing 37 and the gangs of high-voltage resistors 41 are shown as housed in the air-cooled portion 44. FIG. 11, likewise, shows a cross-sectional view along the lines E-E of FIG. 9. This view illustrates the relative positional relationships of components within the air-cooled portion of the example alternative tank/housing arrangement.

This written description uses various examples to disclose exemplary implementations of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A housing apparatus for electrostatic precipitator voltage control circuitry components, comprising:

a hermetically sealable high-voltage component tank portion filled with a liquid coolant and containing at least a high-voltage transformer-rectifier component set submerged within the liquid coolant, a removable cover plate on a top side of the tank portion, a high-voltage output terminal insulating bushing mounted through the removable cover plate at the top side of the tank portion, the tank portion having at least one panel-type radiator structure mounted on an outside wall of the tank portion for circulating and cooling the liquid coolant, wherein the liquid coolant contained within the tank portion circulates through the radiator structure via convection currents when heated by the submerged high-voltage transformer-rectifier component set;

a liquid-free air-cooled high-voltage component compartment sharing a common sidewall with the tank portion, one or more high-voltage conductor pass-through insulating bushings mounted through the common sidewall, and a high-voltage spiral-wound capacitor filter network contained in the liquid-free air-cooled high-voltage component compartment.

2. The housing apparatus according to claim 1 wherein the liquid coolant is an insulating high-dielectric oil.

3. The housing apparatus according to claim 1 wherein the removable cover plate includes a removable access panel.

4. The housing apparatus according to claim 1 wherein the removable cover plate includes a protective guard ring mounted to a top side of the cover surrounding the high-voltage output terminal insulating bushing.

5. The housing apparatus according to claim 1 further including a gasket fitted between the removable cover plate and the tank portion which provides a hermetic seal.

6. The housing apparatus according to claim 1 further including a coolant liquid drain spigot mounted on a side of the tank portion.

7. The housing apparatus according to claim 1 further comprising an external liquid-free air-cooled low-voltage component compartment formed on an outside of the tank portion and containing one or more AC input voltage controlling SCRs.

8. The housing apparatus according to claim 1 having two of the panel-type radiator structures, which are mounted at opposite sides of the tank compartment.

9. An electrostatic precipitator voltage control circuit housing, comprising:

a high-voltage component compartment having a separate smaller low-voltage component compartment formed on a side of the high-voltage component compartment and sharing a portion of a common wall with the high-voltage component compartment, the high-voltage component compartment being at least partially filled with a liquid coolant and having a removable cover plate on a top side;

a high-voltage transformer-rectifier component set and a high-voltage spiral-wound capacitor filter network including one or more series-connected current-limiting resistors mounted in the high-voltage component compartment and immersed within the liquid coolant;

a pair of multi-fin hollow panel type radiators attached to one or more sides of the housing, wherein the liquid coolant contained within the high-voltage component compartment circulates through the radiators via convection currents when heated;

a plurality of pass-through terminals mounted in the common wall portion of the housing in the interior of the low-voltage component compartment between the high-voltage component compartment and the low-voltage component compartment for passing at least an AC current from components in the low-voltage component compartment to the high-voltage transformer-rectifier component set within the high-voltage component compartment; and a high-voltage insulating bushing mounted on a top portion of the high-voltage component compartment of the housing and extending into the liquid coolant for providing a high voltage for the electrostatic precipitator device at an output terminal external to the housing;

a sealed capacitor casing for housing one or more high-voltage spiral-wound capacitor components, the casing being mounted within the high-voltage component compartment on a support base adjacent to the transformer component.

10. The electrostatic precipitator voltage control circuit housing of claim 9, wherein a transformer component of the high-voltage transformer-rectifier set is mounted within the high-voltage component compartment, on the support base.

11. The electrostatic precipitator voltage control circuit housing of claim 9, wherein a plurality of high-voltage bridge rectifier components of the high-voltage transformer-rectifier set are mounted on a vertically oriented heat-sink positioned between the transformer component and the sealed capacitor casing.

12. The electrostatic precipitator voltage control circuit housing of claim 11 wherein the vertically oriented heat-sink is suspended from a cross-bar bracket attached to opposing interior sides of the high-voltage component compartment.

13. The electrostatic precipitator voltage control circuit housing of claim 9, wherein one or more high-voltage insulators are mounted on a top portion of the sealed capacitor casing.

14. The electrostatic precipitator voltage control circuit housing of claim 13, wherein one or more high-voltage resistors are mounted on each high-voltage insulator.

15. The electrostatic precipitator voltage control circuit housing of claim 9, wherein the liquid coolant is an electrically insulating dielectric oil.

16. The housing apparatus according to claim 9 wherein the removable cover plate includes a removable access panel.

17. The housing apparatus according to claim 9 wherein the removable cover plate includes a protective guard ring mounted to a top side of the cover plate surrounding the high-voltage insulating bushing.

18. The electrostatic precipitator voltage control circuit housing of claim 9 further including a coolant liquid drain spigot mounted on a side of the high-voltage component compartment.

19. An electrostatic precipitator voltage control circuit housing, comprising:

a high-voltage component compartment having a separate smaller low-voltage component compartment formed on a side of the high-voltage component compartment and sharing a portion of a common wall with the high-voltage component compartment, the high-voltage component compartment being at least partially filled with a liquid coolant and having a removable cover plate on a top side;

a high-voltage transformer-rectifier component set and a high-voltage spiral-wound capacitor filter network including one or more series-connected current-limiting resistors mounted in the high-voltage component compartment and immersed within the liquid coolant;

a pair of multi-fin hollow panel type radiators attached to one or more sides of the housing, wherein the liquid coolant contained within the high-voltage component compartment circulates through the radiators via convection currents when heated;

a plurality of pass-through terminals mounted in the common wall portion of the housing in the interior of the low-voltage component compartment between the high-voltage component compartment and the low-voltage component compartment for passing at least an AC current from components in the low-voltage component compartment to the high-voltage transformer-rectifier component set within the high-voltage component compartment;

a high-voltage insulating bushing mounted on a top portion of the high-voltage component compartment of the housing and extending into the liquid coolant for providing a high voltage for the electrostatic precipitator device at an output terminal external to the housing; and one or more electrical reactance components mounted on a support cross-bar bracket attached to opposing interior sides of the high-voltage component compartment above a portion of a transformer component of the high-voltage transformer-rectifier set.

20. An apparatus for housing electrostatic precipitator control circuitry, comprising:

a liquid-cooled high-voltage component tank compartment having a separate air-cooled high-voltage component compartment formed on an outside portion of the liquid-cooled tank compartment and sharing a common sidewall with the air-cooled compartment, the liquid-cooled high-voltage component tank compartment being at least partially filled with a liquid dielectric coolant and having a removable cover plate on a top side;

a first multi-fin hollow panel type radiator attached to one side of the liquid-cooled high-voltage component tank compartment, wherein the liquid dielectric coolant contained within the tank compartment is circulated through the radiator via convection currents;

a high-voltage conductor pass-through insulating bushing mounted on a top portion of the liquid-cooled tank compartment and extending into the liquid dielectric coolant for providing a high-voltage output terminal for connecting to an electrostatic precipitator device external to the housing; and one or more high-voltage conductor pass-through insulating bushings mounted through the common sidewall between the liquid-cooled high-voltage component tank compartment and the air-cooled high-voltage component compartment;

wherein at least a high-voltage transformer-rectifier component set is mounted within the liquid-cooled high-voltage component tank compartment and is submerged within the liquid dielectric coolant, and wherein a high-voltage spiral-wound capacitor filter network including one or more series-connected current-limiting resistors is mounted within the air-cooled high-voltage component compartment.

21. The housing apparatus according to claim 20 further comprising a smaller low-voltage component compartment formed on a side of the liquid-filled high-voltage component compartment and sharing a portion of a common wall with the liquid-filled high-voltage component compartment.

22. The housing apparatus according to claim 20 further comprising a plurality of conductor pass-through bushings mounted in the common wall portion between the high-voltage component compartment and the low-voltage component compartment for passing at least an AC current from components in the low-voltage component compartment to the high-voltage transformer-rectifier set within the high-voltage component compartment.

23. The housing apparatus according to claim 20 wherein the liquid coolant is an insulating high-dielectric oil.

24. The housing apparatus according to claim 20 wherein the removable cover plate includes a removable access panel.

25. The housing apparatus according to claim 20 wherein the removable cover plate includes a protective guard ring mounted to a top side of the cover plate surrounding the high-voltage conductor pass-through insulating bushing.

26. The housing apparatus according to claim 20 further including a gasket fitted between the removable cover plate and the liquid-cooled high-voltage component tank compartment which provides a hermetic seal.

27. The housing apparatus according to claim 20 further including a coolant liquid drain spigot mounted on a side of the liquid-cooled high-voltage component tank compartment.

28. The housing apparatus according to claim 20 further comprising a second multi-fin hollow panel type radiator mounted on a side of the liquid-cooled high-voltage component tank compartment opposite the first multi-fin hollow panel type radiator.

* * * * *